United States Patent
Williams

(10) Patent No.: US 11,985,789 B2
(45) Date of Patent: May 14, 2024

(54) MODULE FOR A TELECOMMUNICATIONS POLE

(71) Applicant: CommScope Technologies LLC, Hickory, NC (US)

(72) Inventor: Richard D. Williams, Wylie, TX (US)

(73) Assignee: CommScope Technologies LLC, Claremont, NC (US)

(*) Notice: Subject to any disclaimer, the term of this patent is extended or adjusted under 35 U.S.C. 154(b) by 475 days.

(21) Appl. No.: 17/188,088

(22) Filed: Mar. 1, 2021

(65) Prior Publication Data

US 2021/0315126 A1 Oct. 7, 2021

Related U.S. Application Data

(60) Provisional application No. 63/006,149, filed on Apr. 7, 2020.

(51) Int. Cl.
*H05K 7/18* (2006.01)
*E04H 12/00* (2006.01)
*H05K 5/02* (2006.01)

(52) U.S. Cl.
CPC .......... *H05K 7/186* (2013.01); *E04H 12/003* (2013.01); *H05K 5/0217* (2013.01)

(58) Field of Classification Search
CPC ..... E04H 12/003; E04H 12/08; E04H 12/085; E04C 3/32; H05K 5/0217; H05K 7/14; H05K 7/18; H05K 7/186
See application file for complete search history.

(56) References Cited

U.S. PATENT DOCUMENTS

| | | | | |
|---|---|---|---|---|
| 7,464,513 | B2 * | 12/2008 | Rioux ..................... | E04H 12/08 52/651.1 |
| 7,827,762 | B2 * | 11/2010 | Griffiths .............. | E04F 13/0733 138/155 |

(Continued)

FOREIGN PATENT DOCUMENTS

| | | | | |
|---|---|---|---|---|
| CN | 114396192 A | * | 4/2022 | |
| DE | 102012011175 A1 | * | 12/2013 | ........... E04H 12/085 |

(Continued)

OTHER PUBLICATIONS

PCT Notification of Transmittal of the International Search Report and the Written Opinion of the International Searching Authority, or the Declaration, dated Jun. 16, 2021, for corresponding PCT International Application No. PCT/US2021/020197 (13 pages).

*Primary Examiner* — Ryan D Kwiecinski
(74) *Attorney, Agent, or Firm* — Myers Bigel, P.A.

(57) ABSTRACT

The present disclosure describes a module for a telecommunications pole. The module may include a main base plate configured such that telecommunications equipment can be mounted thereto, a top frame member and a bottom frame member coupled to opposing ends of the main base plate and extending outwardly from, and generally perpendicularly to, the main base plate; and a plurality of side frame members coupled to the top and bottom frame members, each side frame member extending collinearly with the main base plate. The top, bottom and side frame members each include a plurality of recesses and protrusions configured and/or positioned such that the top, bottom, and side frame members may be aligned and assembled within the telecommunications pole. Module assemblies and methods of assembling the modules are also described herein.

19 Claims, 6 Drawing Sheets

(56) References Cited

U.S. PATENT DOCUMENTS

| | | | | |
|---|---|---|---|---|
| 7,886,492 B2* | 2/2011 | Kelly | E04H 12/2261 52/297 |
| 9,371,663 B2* | 6/2016 | Pereira | E04H 12/182 |
| 10,550,596 B2* | 2/2020 | Santucci | F03D 13/40 |
| 10,640,987 B2* | 5/2020 | Stuart | E04F 13/0736 |
| D930,856 S * | 9/2021 | Santini | D25/126 |
| D932,060 S * | 9/2021 | Santini | D25/126 |
| 11,143,371 B2* | 10/2021 | Bembridge | F21S 8/088 |
| 11,236,875 B2* | 2/2022 | Chen | E04H 12/003 |
| 11,262,037 B2* | 3/2022 | Bijl | H05K 7/20136 |
| 11,359,399 B2* | 6/2022 | Reyes | H01Q 1/246 |
| 11,365,554 B2* | 6/2022 | Chia | F21S 8/085 |
| 11,417,943 B2* | 8/2022 | Hendrix | H04B 1/036 |
| 11,437,701 B2* | 9/2022 | Rai | H01Q 1/125 |
| 11,456,528 B2* | 9/2022 | Gienger | H01Q 1/1242 |
| 11,466,471 B2* | 10/2022 | Yanda | E04H 12/003 |
| 11,619,082 B2* | 4/2023 | Williams | H01Q 1/1242 52/831 |
| 11,655,649 B2* | 5/2023 | Mesch | H05K 5/0204 174/45 R |
| 11,802,670 B2* | 10/2023 | Pretorius | F21V 21/10 |
| 2009/0038534 A1* | 2/2009 | Somers | E04H 12/003 116/173 |
| 2010/0026604 A1 | 2/2010 | Caldwell et al. | |
| 2011/0156984 A1* | 6/2011 | Caldwell | H01Q 1/1207 343/890 |
| 2015/0013261 A1* | 1/2015 | Kolokotronis | B23P 15/00 52/651.07 |
| 2015/0089901 A1* | 4/2015 | Chan | E04H 12/003 52/848 |
| 2016/0290619 A1* | 10/2016 | Galloppa | F21V 23/06 |
| 2017/0214113 A1* | 7/2017 | Norrell | H01Q 1/44 |
| 2017/0214114 A1* | 7/2017 | Norrell | H01Q 1/1242 |
| 2018/0371783 A1* | 12/2018 | Reyes | E04H 12/003 |
| 2019/0277050 A1* | 9/2019 | Lockwood | H01Q 1/1242 |
| 2020/0136236 A1* | 4/2020 | Colapietro | H01Q 21/0025 |
| 2020/0378164 A1* | 12/2020 | Williams | H01Q 1/1242 |
| 2021/0261008 A1* | 8/2021 | Lapham | B60L 53/31 |
| 2021/0315126 A1* | 10/2021 | Williams | H05K 5/0217 |
| 2021/0320393 A1* | 10/2021 | Williams | H01Q 1/1221 |
| 2021/0396365 A1* | 12/2021 | Friederichs | H02G 3/0406 |
| 2022/0248556 A1* | 8/2022 | Chase | H04Q 1/025 |

FOREIGN PATENT DOCUMENTS

| | | | | |
|---|---|---|---|---|
| EP | 1681408 A2 * | 7/2006 | | E04H 12/003 |
| EP | 2672115 A2 * | 12/2013 | | E04H 12/085 |
| JP | 2016188514 A * | 11/2016 | | |
| JP | 2016188514 A | 11/2016 | | |
| WO | WO-2013154416 A1 * | 10/2013 | | E04C 3/32 |
| WO | WO-2018231147 A1 * | 12/2018 | | E04C 3/36 |
| WO | 2019005267 A1 | 1/2019 | | |
| WO | WO-2021207583 A1 * | 10/2021 | | E04H 12/003 |

* cited by examiner

MODULE FOR A TELECOMMUNICATIONS POLE

RELATED APPLICATION(S)

The present application claims priority to and the benefit of U.S. Provisional Patent Application Ser. No. 63/006,149, filed Apr. 7, 2020, the disclosure of which is hereby incorporated herein in its entirety.

FIELD

The present application is directed generally toward telecommunications equipment, and more particularly, a module for mounting telecommunications equipment within a telecommunications pole.

BACKGROUND

The placement of telecommunication equipment modules (e.g., power equipment modules) within a telecommunications pole is critical. Improperly placement of the modules within the telecommunications poles can result in increased manufacturing and reworking costs. However, the working conditions within a telecommunications pole (e.g., limited space and visibility) may make the alignment and assembly of current modules difficult and labor intensive for a technician, especially when placing parts into the weldments of the poles. Thus, there may be a need for telecommunications equipment modules with features that may assist a technician in aligning parts of the module when assembling the module within a telecommunications pole.

SUMMARY

A first aspect of the present invention is directed to a module for a telecommunications pole. The module may include a main base plate configured such that telecommunications equipment can be mounted thereto, a top frame member and a bottom frame member coupled to opposing ends of the main base plate and extending outwardly from, and generally perpendicularly to, the main base plate, and a plurality of side frame members coupled to the top and bottom frame members, each side frame member extending collinearly with the main base plate. The top, bottom and side frame members each include a plurality of recesses and protrusions configured and/or positioned such that the top, bottom, and side frame members may be aligned and assembled within the telecommunications pole.

Another aspect of the present invention is directed to a module assembly. The assembly may include a telecommunications pole and a module configured to fit within the telecommunications pole. The module may include a main base plate configured to be mounted to an interior surface of the telecommunications pole, a top frame member and a bottom frame member coupled to opposing ends of the main base plate and extending outwardly from, and generally perpendicularly to, the main base plate, the top and bottom frame members comprising a plurality of recesses and protrusions, and a plurality of side frame members coupled to the top and bottom frame members, each side frame member extending collinearly with the main base plate, the side frame members comprising a plurality of recesses and protrusions. One or more protrusions of the side frame members are received and secured by respective recesses of the top and bottom frame members, thereby allowing a technician to align and assemble the module while within the telecommunications pole.

Another aspect of the present invention is directed to a method of assembling a module within a telecommunications pole. The method may include providing a module for telecommunications equipment. The module may include a main base plate, a top frame member and a bottom frame member having a plurality of recesses and protrusions, and a plurality of side frame members having a plurality of recesses and protrusions. The method may further include securing the main base plate to an interior surface of the telecommunications pole, securing the top frame member to a top end of the main base plate, inserting a protrusion located at one end of each side frame member into a respective recess within the top frame member, inserting a protrusion located at the opposing end of each side frame member into a respective recess within the bottom frame member; and securing the bottom frame member to the opposing bottom end of the main base plate, thereby securing the side frame members between the top and bottom frame members.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the detailed description of the preferred embodiments that follow, such description being merely illustrative of the present invention.

DETAILED DESCRIPTION

Figure 1:
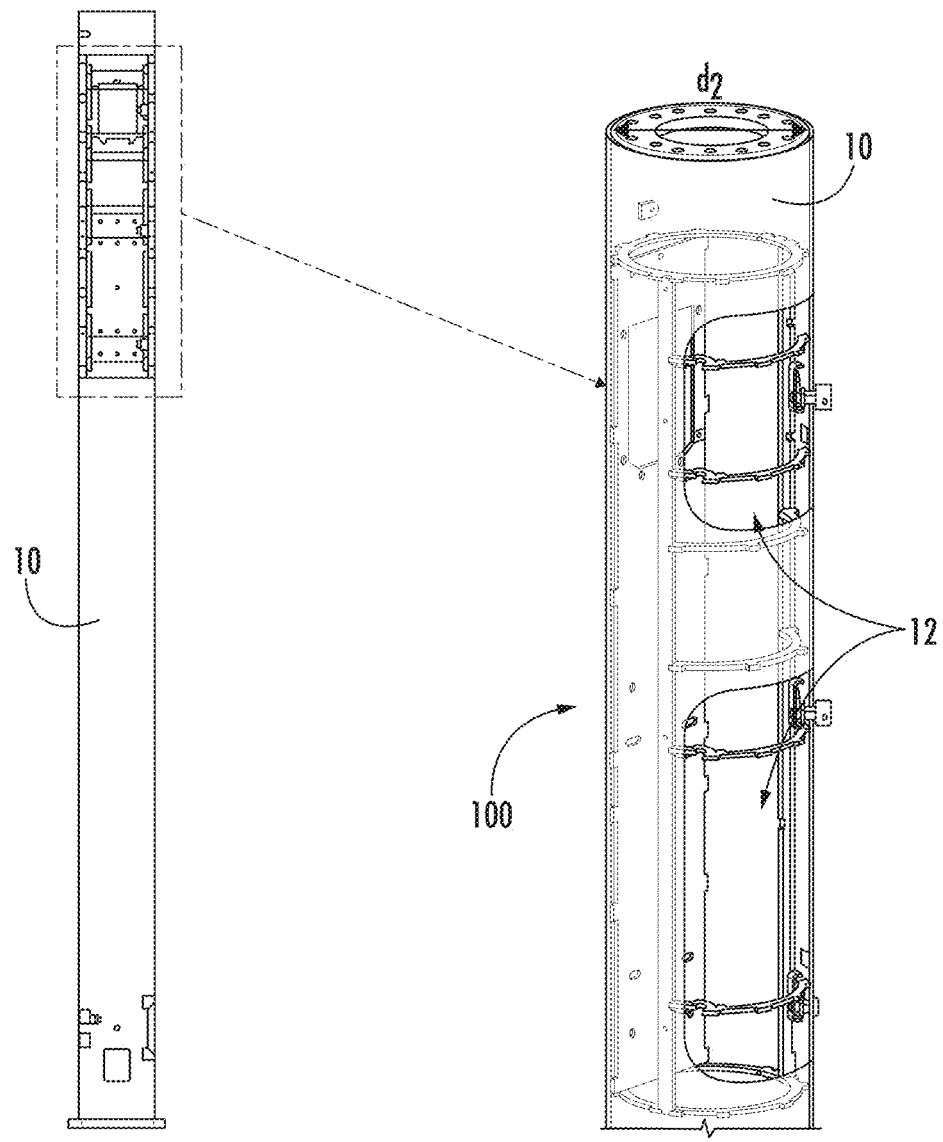
FIG. 1 is a front view of a telecommunications pole illustrating in the inset a module secured within the telecommunications pole according to embodiments of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The present invention now will be described more fully hereinafter with reference to the accompanying drawings, in which illustrative embodiments of the invention are shown. Like numbers refer to like elements throughout and different embodiments of like elements can be designated using a different number of superscript indicator apostrophes (e.g., 10′, 10″, 10‴).

In the figures, certain layers, components or features may be exaggerated for clarity, and broken lines illustrate optional features or operations unless specified otherwise. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. The sequence of operations (or steps) is not limited to the order presented in the claims or figures unless specifically indicated otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Pursuant to embodiments of the present invention, modules are provided with features that may assist a technician in aligning parts when assembling the module within a telecommunications pole, thereby allowing for easier installation of part placement into the weldments of a telecommunications pole. Module assemblies and methods of assembling are also provided herein. Embodiments of the present invention will now be discussed in greater detail with reference to FIGS. 1-4B.

Figure 2:
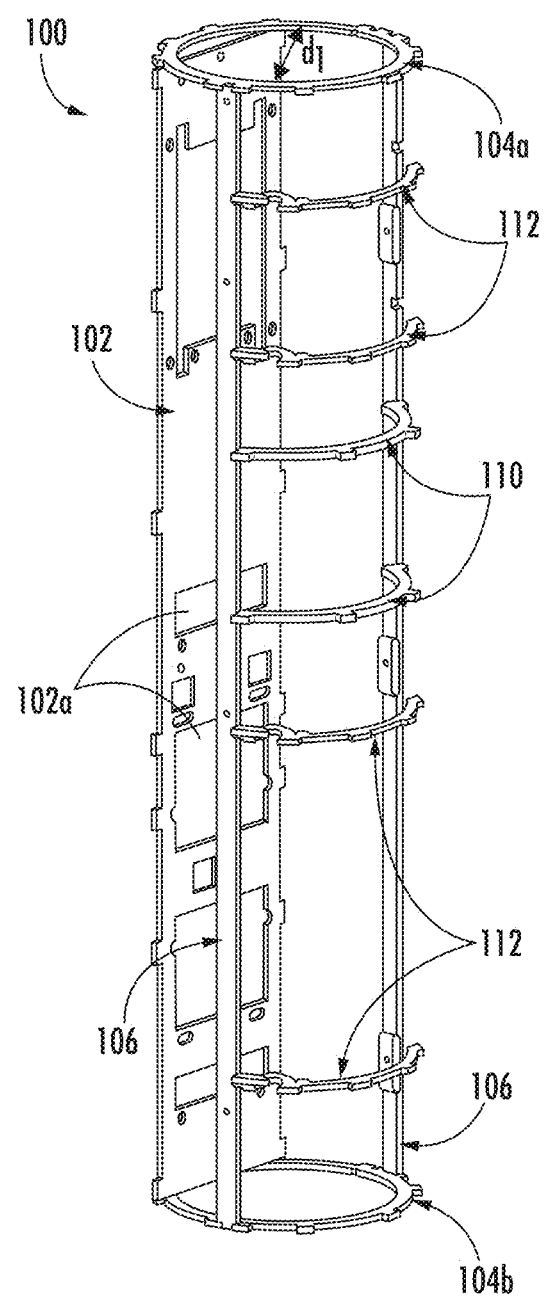
FIG. 2 is a perspective view of the module of FIG. 1 according to embodiments of the present invention.

FIG. 1 and FIG. 2 illustrate a module 100 according to embodiments of the present invention. As shown in FIG. 1, the module 100 may be installed within a telecommunications pole 10, e.g., a monopole. When installed within a telecommunications pole 10, the module 100 is designed such that it may help a technician align parts for assembly (e.g., placement and/or welding) within the telecommunications pole 10.

As shown in FIG. 2, the module 100 of the present invention may include a main base plate (or body) 102, top and bottom frame members 104a, 104b, and a pair of side frame members 106. In some embodiments, the module 100 may further include a plurality of frame support members 110 and a plurality of door support members 112. As discussed in further detail below, the top and bottom frame members 104a, 104b and/or the side frame members 106 may comprise alignment features (e.g., protrusions (or tabs) 104p, 106p and/or recesses (or slots) 104s, 106s that may assist a technician when aligning and securing (or mounting) the frame support members 110, the door support members 112 and/or additional elements/parts to the module 100, for example, when the technician is assembling the module 100 within the telecommunications pole 10.

In some embodiments, the main base plate 102 may be mounted or secured to an interior surface of the telecommunications pole 10 and may serve as the structural backbone of the module 100. The main base plate 102 is also configured such that telecommunications equipment 20 (e.g., power equipment) may be mounted and secured thereto. For example, in some embodiments, AC power input components may be mounted and secured to the main base plate 102. Other exemplary equipment that may be secured to the main base plate 102 includes radios, multi-carrier power amplifiers (MCPA), power supplies, and batteries. As shown in FIG. 2, in some embodiments, the main base plate 102 may comprise a plurality of mounting apertures 102a. The mounting apertures 102a may be sized and configured to accommodate different sizes and types of telecommunications (power) equipment 20 that may be mounted and secured to the module 100 of the present invention (and within the telecommunications pole 10) (see also, e.g., FIGS. 3A-3C).

The top and bottom frame members 104a, 104b of the module 100 may be coupled to opposing ends of the main base plate 102 and extend generally perpendicularly to the main base plate 102. As shown in FIG. 2, in some embodiments, the main base plate 102 may be coupled to a rear portion of the top and bottom frame members 104a, 104b with a front portion of the top and bottom frame members 104a, 104b extending outwardly, and generally perpendicularly, from the main base plate 102. As used herein, the "rear" of the module 100 or assembly 200 refers to a section or portion of the module 100 or assembly 200 that is located opposite to an access door 12 (or an opening for an access door 12) of a telecommunications pole 10. As used herein, the "front" of the module 100 or assembly 200 refers to a section or portion of the module 100 or assembly 200 located adjacent to or proximate to an access door 12 (or an opening for an access door 12) of a telecommunications pole 10.

In some embodiments, the top and bottom frame members 104a, 104b may be annular having a diameter ($d_1$) that is slightly less than the diameter ($d_2$) of a telecommunications pole 10 such that the module 100 fits within the interior of the telecommunications pole 10. For example, in some embodiments, the top and bottom frame members 104a, 104b may have a diameter ($d_1$) in the range of about 11 inches to about 17 inches. In some embodiments, the module 100 may be configured to fit within a telecommunications pole 10 having a diameter ($d_2$) in the range of about 12 inches to about 18 inches.

Figure 3A:
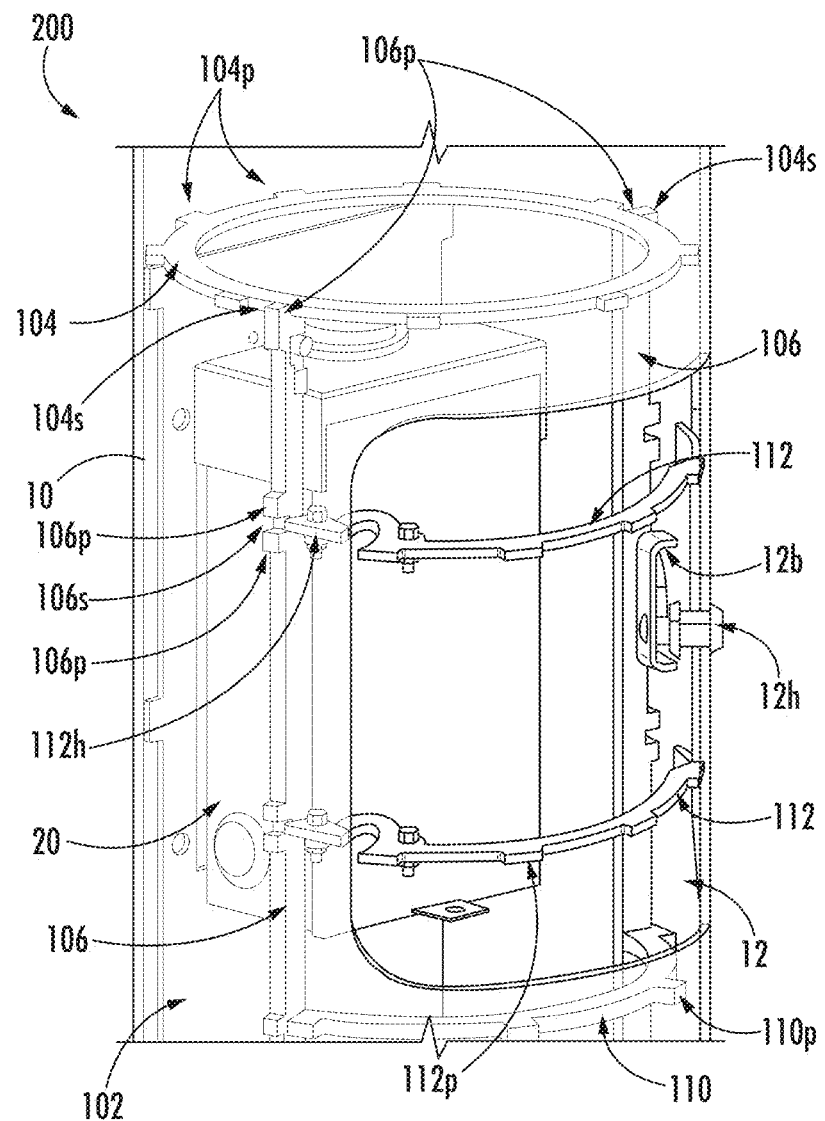
FIG. 3A is an enlarged view of the top portion of a module assembly utilizing the module of FIG. 2 according to embodiments of the present invention.
Figure 3B:
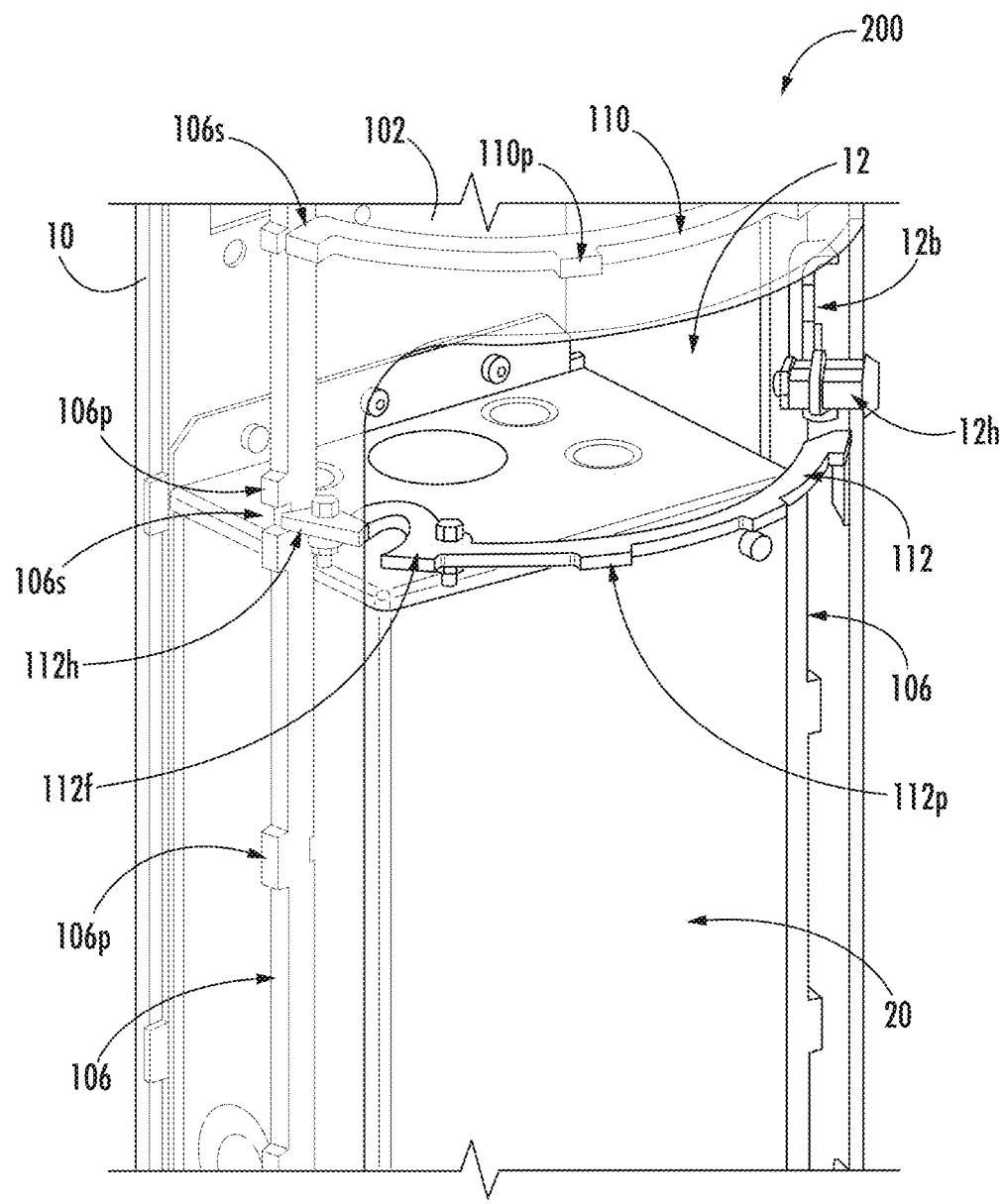
FIG. 3B is an enlarged view of the middle portion of the module assembly of FIG. 3A.
Figure 3C:
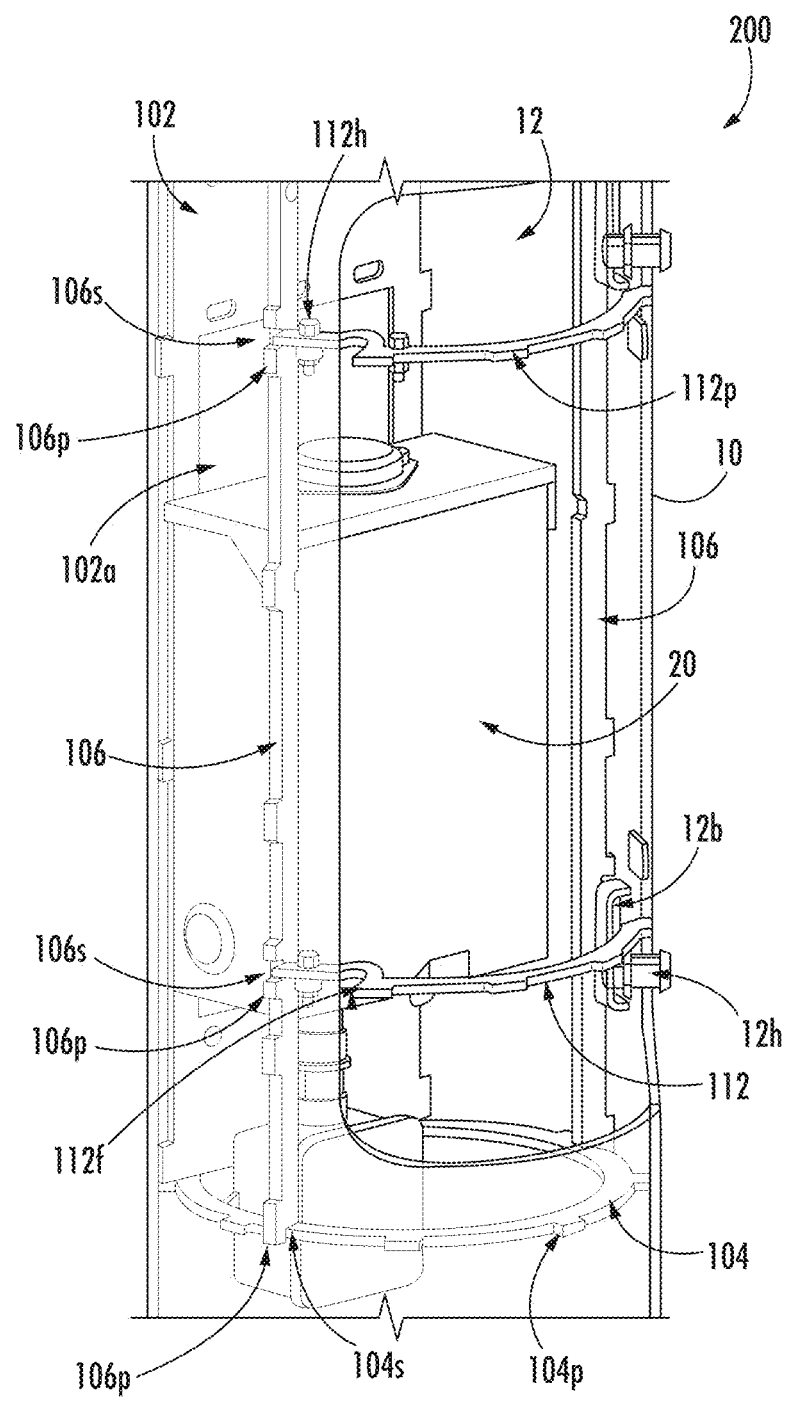
FIG. 3C is an enlarged view of the bottom portion of the module assembly of FIG. 3A and FIG. 3B.

As shown in FIG. 3A and FIG. 3C, in some embodiments, the top and bottom frame members 104a, 104b may comprise a plurality of protrusions 104p that extend radially outwardly from an outer periphery of the top and bottom frame members 104a, 104b. In some embodiments, the protrusions 104p extend radially outwardly a sufficient distance such that an outer edge of each protrusion 104p is adjacent to or in contact with an interior surface of the telecommunications pole 10. In some embodiments, each protrusion 104p may provide a contact point for securing (e.g., welding) the top and bottom frame members 104a, 104b to the interior surface of the telecommunications pole 10.

As shown in FIG. 2, opposing ends of each side frame members 106 are coupled to the top and bottom frame members 104a, 104b. The side frame members 106 extend collinearly with the main base plate 102 of the module 100 between the top and bottom frame members 104a, 104b. In some embodiments, each side frame member 106 may comprise a plurality of protrusions (or tabs) 106p. As shown in FIG. 3A and FIG. 3C, a protrusion 106p may be located at each end of the side frame members 106p. The protrusions 106p located at the ends of the side frame members 106p may be configured to engage the respective top and bottom frame members 104a, 104b, thereby securing the side frame members 106 to the top and bottom frame members 104a, 104b. For example, in some embodiments, the top and bottom frame members 104a, 104b may further comprise a plurality of recesses (or slots) 104s that are configured to receive the protrusions 106p of the side frame members 106 (e.g., similar to a tongue and groove fastener).

To assemble the module 100 of the present invention within the telecommunications pole 10, a technician may first secure the main base plate 102 to an interior surface of the telecommunications pole 10. The top frame member 104a may then be secured to a top end of the main base plate 102. The ends of the side frame members 106 (i.e., protrusions 106p located at the end of the side frame members 106) may then be inserted and secured into respective recesses 104s in the top frame member 104a. The opposing ends of the side frame members 106 (i.e., protrusions 106p located at the opposing end of the side frame members 106) may then be inserted and secured into respective recesses 104s in the bottom frame member 104b and the bottom frame member 104b secured to the opposing end of the main base plate 102. Thus, the protrusions 106p of the side frame members 106p and corresponding recesses 104s of the top and bottom frame members 104a, 104b may provide guidance to a technician when aligning these parts and assembling the module 100 within a telecommunications pole 10, thereby allowing for easier and faster installation of the module 100 of the present invention.

As shown in FIGS. 3A-3C, in some embodiments, the side frame members 106 may further comprise a plurality of recesses (or slots) 106s. As discussed in further detail below, the recesses 106s of the side frame members 106 may be configured to receive respective hinges 112h for the doors 12 of the telecommunications pole 10 and/or the ends of frame support members 110 of the module 100 (see, e.g., FIGS. 4A-4B). In addition, similar to the recesses 104s of the top and bottom frame members 104a, 104b described herein, the recesses 106s of the side frame members 106 may also provide further guidance to a technician when aligning and installing parts for the module 100, e.g., securing/mounting the doors 12 (e.g., hinges 112h, door support frame members 112).

In some embodiments, the module 100 of the present invention may further include a plurality of frame support members 110. In some embodiments, each frame support member 110 is coupled to and extends generally perpendicularly between two adjacent side frame members 106 (see, e.g., FIG. 2). As shown in FIG. 3B, in some embodiments, the ends of the frame support members 110 may be received by a recess (or slot) 106s of the side frame members 106 (e.g., similar to a tongue and groove fastener) (see also, e.g., FIGS. 4A-4B). In some embodiments, additional protrusions 106p along the side frame members 106 may indicate to a technician where the recess 106s is located and may be used by a technician to help position the frame support members 110 in the module 100. When securing the frame support members 110 to the module 100 within the telecommunications pole 10, a technician may align the ends of the frame support members 110 with the protrusions 106p which may help engage the ends of the frame support members 110 with the recesses 106s of the side frame members 106.

In some embodiments, the frame support members 110 are arcuate such that the frame support members 110 correspond with the arcuate profile of an interior surface of the telecommunications pole 10. The frame support members 110 may be used to provide additional structural support to the module 100 when installed within the telecommunications pole 10, for example, when telecommunications equipment 20 is secured to the module 100. In some embodiments, the frame support members 110 may comprise a plurality of protrusions 110p. The protrusions 110p may extend radially outwardly from the frame support members 110. For example, similar to the protrusions 104p of the top and bottom frame members 104a, 104b, in some embodiments, the protrusions 110p of the frame support members 110 may extend radially outwardly a sufficient distance such that an outer edge of each protrusion 110p is adjacent to or in contact with an interior surface of the telecommunications pole 10. In some embodiments, each protrusion 110p may provide a contact point for securing (e.g., welding) the frame support members 110 to the interior surface of the telecommunications pole 10.

In some embodiments, the module 100 of the present invention may further include a plurality of door support members 112. Each door support member 112 may comprise a door hinge 112h. See, e.g., U.S. Provisional Patent Application Ser. No. 62/853,989 filed May 29, 2019, which contents are hereby incorporated by reference in its entirety. The door hinge 112h is located at an end of each door support member 112 and is configured to be received by a respective recess 106s in a side frame member 106 (see, e.g., FIGS. 3B-3C and FIGS. 4A-4B). In some embodiments, the door support members 112 are arcuate such that the door support members 112 correspond with the arcuate profile of an interior surface of an access door 12 to the telecommunications pole 10. In some embodiments, the door support members 112 may comprise a plurality of protrusions 112p. Similar to the protrusions 110p of the frame support members 110, in some embodiments, the protrusions 112p may extend radially outwardly from the door support members 112. In some embodiments, the protrusions 112p of the door support members 110 may extend radially outwardly a sufficient distance such that an outer edge of each protrusion 112p is adjacent to or in contact with an interior surface of an access door 12 of telecommunications pole 10. In some embodiments, each protrusion 112p may provide a contact point for securing (e.g., welding) the door support members 112 to the interior surface of an access door 12 of the telecommunications pole 10.

Similar to the frame support members 110, the recesses 106s and protrusions 106p along the side frame member(s) 106 may help guide a technician to align the door support members 112 (and respective door hinges 112h) in the correct position on the side frame member 106 such that the corresponding access door 12 of the telecommunications pole 10 is secured in the correct position on the telecommunications pole 10.

In some embodiments, the orientation of the side frame members 106 may vary. For example, in some embodiments, the side frame members 106 may be oriented such that the recesses 106s open, and the protrusions 106p extend outwardly, in a direction toward the front of the module 100 (see, e.g., FIG. 2). In some embodiments, the side frame members 106 may be oriented such that the recesses 106s open, and the protrusions 106p extend radially outwardly, e.g., similar to the protrusions 104p and/or recesses 104s of the top and bottom frame members (see, e.g., FIGS. 3A-3C). The direction in which the protrusions 106p extend may provide additional contact point(s) for securing (e.g., welding) the side frame members 106 (i.e., the module 100) to the interior surface of the telecommunications pole 10.

Figure 4A:
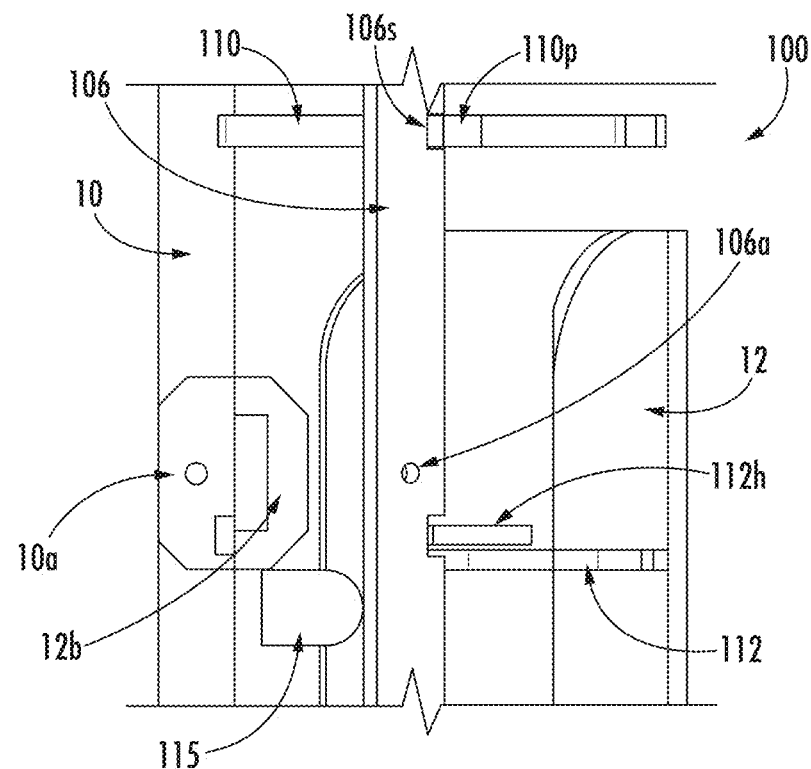
FIG. 4A is an enlarged view of an alignment feature of the module of FIG. 2.
Figure 4B:
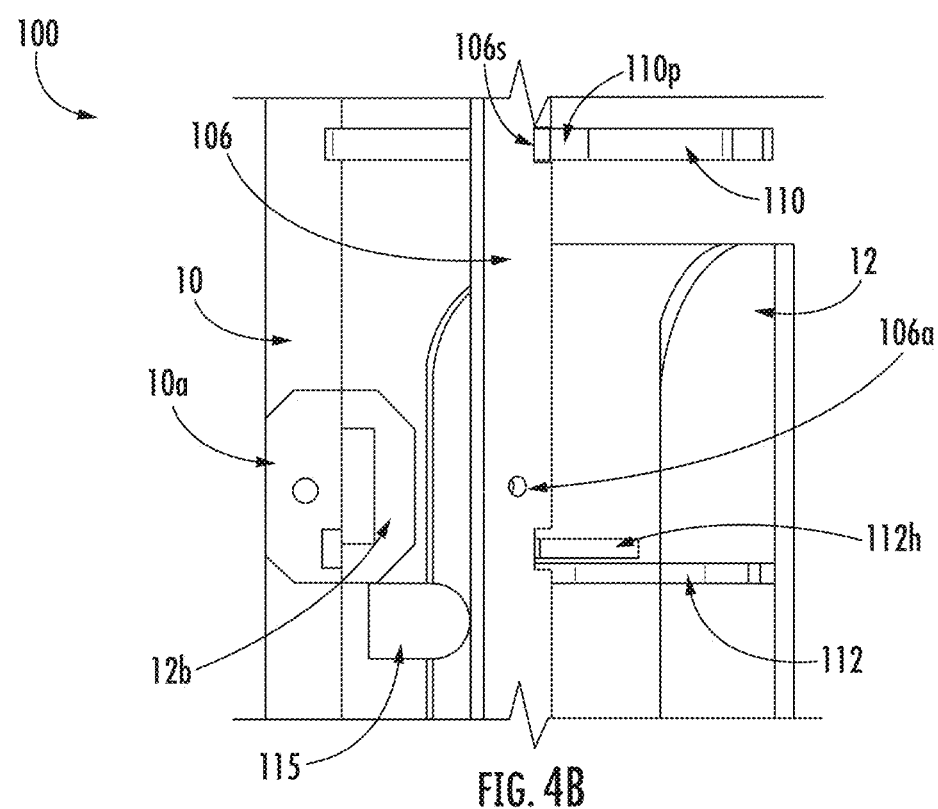
FIG. 4B is an enlarged view of another alignment feature of the module of FIG. 2.

Referring now to FIGS. 4A-4B, the module 100 of the present invention may comprise additional alignment features 106a, 115 that may further assist a technician when installing the module 100 within a telecommunications pole 10. As shown in FIG. 4A, in some embodiments, at least one of the side frame members 106 may comprise one or more alignment holes 106a. To align the side frame member(s) 106 of the module 100 within the telecommunications pole 10, the alignment hole(s) 106a may be aligned with corresponding bracket hole(s) 10a (or other designated marker) in the interior surface of the telecommunications pole 10. The bracket hole 10a may also be used to align a door bracket 12b secured to an interior surface of the telecommunications pole 10. The door bracket 12b is configured to receive a door handle latch 12h to keep the door 12 closed. Alignment of the alignment hole 106a with the bracket hole 10a may help to position the side frame members 106 in the correct position within the telecommunications pole 10, thereby allowing a technician to properly align the door support frames 112 (and corresponding access door 12) in the correct position on the telecommunications pole 10.

As shown in FIG. 4B, in some embodiments, the module 100 of the present invention may comprise one or more vertical alignment extender 115. In some embodiments, the vertical alignment extender(s) 115 may extend outwardly from at least one of side frame members 106. As shown in FIG. 4B, the vertical alignment extender 115 may be used by a technician to help align the side frame member 106 with the door bracket 12b. For example, in some embodiments, a technician may align the vertical alignment extender 115 with a bottom edge of the door bracket 12b. This aligns the side frame member 106 at the proper height for the technician to secure the side frame member 106 (and module 100) within the telecommunications pole 10. Once the side frame member 106 is properly positioned (secured) within the telecommunications pole 10, a technician may then properly align the other features/parts of the module 100 (e.g., the door support frames 112 and corresponding access door 12 in the correct position on the telecommunications pole 10.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A module for a telecommunications pole, the module comprising:
   a main base plate configured such that telecommunications equipment can be mounted thereto;
   a top frame member and a bottom frame member coupled to opposing ends of the main base plate and extending outwardly from, and generally perpendicularly to, the main base plate; and
   a plurality of side frame members coupled to the top and bottom frame members, each side frame member extending collinearly with the main base plate,
   a plurality of door support members configured to have a door attached thereto, each door support member hingedly coupled to one of the plurality of side frame members,
   wherein opposing ends of each side frame member are configured to be received into respective recesses in the top and bottom frame members such that the top, bottom, and side frame members may be aligned and assembled within the telecommunications pole.

2. The module of claim 1, further comprising a plurality of frame support members coupled to and extending between adjacent side frame members.

3. The module of claim 2, wherein opposing ends of the frame support members are configured to be received by respective recesses of the side frame members.

4. The module of claim 2, wherein the frame support members are arcuate and correspond to the arcuate profile of an interior surface of the telecommunications pole.

5. The module of claim 1, wherein the door support members are arcuate and correspond to the arcuate profile of an interior surface of an access door of the telecommunications pole.

6. The module of claim 1, wherein the top and bottom frame members are annular.

7. The module of claim 1, wherein one or more protrusions of the top, bottom, and/or side frame members provide a contact point to secure the respective top, bottom, and/or side frame members to an interior surface of the telecommunications pole.

8. The module of claim 1, wherein the opposing ends of each side frame member comprise one or more protrusions that are received and secured by the respective recesses of the top and bottom frame members, thereby allowing a technician to align and assemble the module while within the telecommunications pole.

9. The module of claim 1, further comprising one or more additional alignment features configured to assist a technician align the module while assembling the module within the telecommunications pole.

10. The module of claim 9, wherein the one or more additional alignment features is an alignment hole in at least one of the side frame members, the alignment hole being positioned to align with a marker within the telecommunications pole, thereby helping a technician to align the side frame members in the proper position within the telecommunications pole.

11. The module of claim 9, wherein the one or more additional alignment features is a vertical alignment extender, the vertical alignment extender extends outwardly from at least one of the side frame members and is configured to engage a bottom edge of a door bracket secured to an interior surface of the telecommunications pole, thereby aligning the side frame member in a proper position within the telecommunications pole.

12. A module assembly, comprising:
   a telecommunications pole;
   a module configured to fit within the telecommunications pole, the module comprising:
      a main base plate configured to be mounted to an interior surface of the telecommunications pole;
      a top frame member and a bottom frame member coupled to opposing ends of the main base plate and extending outwardly from, and generally perpendicularly to, the main base plate, the top and bottom frame members comprising a plurality of recesses and protrusions; and
      a plurality of side frame members coupled to the top and bottom frame members, each side frame member extending collinearly with the main base plate, the side frame members comprising a plurality of recesses and protrusions;
   wherein one or more protrusions of the side frame members are received and secured by respective recesses of the top and bottom frame members, thereby allowing a technician to align and assemble the module while within the telecommunications pole.

13. The module assembly of claim 12, further comprising one or more additional alignment features configured to assist a technician align the module while assembling the module within the telecommunications pole.

14. The module assembly of claim 13, wherein the one or more additional alignment features is an alignment hole in at least one of the side frame members, the alignment hole being positioned to align with a marker within the telecommunications pole, thereby helping a technician to align the side frame members in the proper position within the telecommunications pole.

15. The module assembly of claim 13, wherein the one or more additional alignment features is a vertical alignment extender, the vertical alignment extender extends outwardly from at least one of the side frame members and is configured to engage a bottom edge of a door bracket secured to an interior surface of the telecommunications pole, thereby aligning the side frame member in a proper position within the telecommunications pole.

16. A method of assembling a module within a telecommunications pole, the method comprising:
   providing a module for telecommunications equipment, the module comprising:
      a main base plate;
      a top frame member and a bottom frame member having a plurality of recesses and protrusions; and
      a plurality of side frame members having a plurality of recesses and protrusions;
   securing the main base plate to an interior surface of the telecommunications pole;
   securing the top frame member to a top end of the main base plate;
   inserting a protrusion located at one end of each side frame member into a respective recess within the top frame member;
   inserting a protrusion located at the opposing end of each side frame member into a respective recess within the bottom frame member; and
   securing the bottom frame member to the opposing bottom end of the main base plate, thereby securing the side frame members between the top and bottom frame members.

17. The method of claim 16, wherein the module further comprises a plurality of frame support members, the method further comprising inserting opposing ends of the frame support members into respective recesses in the side frame members.

18. The method of claim 16, wherein the module further comprises a vertical alignment extender coupled to one or more side frame members, the method further comprising positioning the vertical alignment extender to engage a bottom edge of a door bracket within the telecommunications pole, thereby aligning the side frame member in the proper position within the telecommunications pole.

19. The method of claim 16, wherein the module further comprises an alignment hole in one or more side frame members, the method further comprising positioning the alignment hole with a marker within the telecommunications pole, thereby aligning the side frame member in the proper position within the telecommunications pole.

* * * * *